(12) United States Patent
Han et al.

(10) Patent No.: US 9,139,902 B2
(45) Date of Patent: Sep. 22, 2015

(54) METHOD AND APPARATUS FOR PLASMA ION IMPLANTATION OF SOLID ELEMENT

(75) Inventors: Seung-Hee Han, Seoul (KR); Ji-Young Byun, Seoul (KR); Hyun-Kwang Seok, Seoul (KR); Jun-Hyun Han, Seoul (KR); Yu-Chan Kim, Goyang-si (KR); Sung-Bai Lee, Seoul (KR); Jin-Young Choi, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 232 days.

(21) Appl. No.: 13/044,621

(22) Filed: Mar. 10, 2011

(65) Prior Publication Data

US 2012/0228123 A1    Sep. 13, 2012

(51) Int. Cl.
| | |
|---|---|
| *C23C 14/34* | (2006.01) |
| *C23C 14/35* | (2006.01) |
| *H01J 37/34* | (2006.01) |
| *H01J 37/32* | (2006.01) |
| *C23C 14/48* | (2006.01) |
| *C23C 14/16* | (2006.01) |

(52) U.S. Cl.
CPC ............... *C23C 14/35* (2013.01); *C23C 14/16* (2013.01); *C23C 14/48* (2013.01); *H01J 37/32532* (2013.01); *H01J 37/3438* (2013.01); *H01J 37/3467* (2013.01)

(58) Field of Classification Search
CPC ............ H01J 37/32532; H01J 37/3438; H01J 37/3467; C23C 14/48
USPC ............ 204/192.12, 192.13, 298.08, 298.07, 204/298.16
See application file for complete search history.

(56) References Cited

U.S. PATENT DOCUMENTS

| | | | | |
|---|---|---|---|---|
| 4,933,065 | A * | 6/1990 | Seiler ..................... | 204/298.06 |
| 5,942,089 | A * | 8/1999 | Sproul et al. ............ | 204/192.13 |
| 6,086,730 | A * | 7/2000 | Liu et al. ................ | 204/192.16 |
| 6,117,279 | A * | 9/2000 | Smolanoff et al. ...... | 204/192.12 |
| 6,136,165 | A * | 10/2000 | Moslehi .................. | 204/298.06 |
| 6,413,382 | B1 * | 7/2002 | Wang et al. ............. | 204/192.12 |
| 6,471,830 | B1 * | 10/2002 | Moslehi et al. ......... | 204/192.12 |
| 2006/0191783 | A1 * | 8/2006 | Lee et al. ................ | 204/192.1 |

* cited by examiner

*Primary Examiner* — Jason M Berman
(74) *Attorney, Agent, or Firm* — Lex IP Meister, PLLC

(57) ABSTRACT

Disclosed are an apparatus and a method for plasma ion implantation of a solid element, which enable plasma ion implantation of a solid element. According to the apparatus and method, a sample is placed on a sample stage in a vacuum chamber, and the inside of the vacuum chamber is maintained as a vacuum state. And, gas is supplied in the vacuum chamber, a first pulsed DC power is applied to a magnetron sputtering source so as to generate plasma ions of a solid element. The plasma ions of a solid element sputtered from the source are implanted on the surface of the sample. The first power is a pulse DC power capable of applying a high power the moment a pulse is applied while maintaining low average power. And, simultaneously with the applying of the first pulse power, a second power may be supplied to the sample stage, which is a high negative voltage pulse accelerating plasma ions of a solid element to the sample and synchronized to the pulse DC power for magnetron sputtering source. And, inductively coupled plasma may be generated in the vacuum chamber via antenna so as to increase ionization rate of a solid element and lower operation pressure of magnetron sputtering source.

9 Claims, 3 Drawing Sheets

METHOD AND APPARATUS FOR PLASMA ION IMPLANTATION OF SOLID ELEMENT

BACKGROUND OF THE INVENTION (a) Field of the Invention

This disclosure relates to an apparatus and a method for plasma ion implantation of a solid element. More particularly, this disclosure relates to an apparatus and a method for plasma ion implantation of solid elements, which may implant ions of non-gaseous elements at room temperature into the surface of a sample.

(b) Description of the Related Art

In general, to improve durability of metal material or parts, coating of a high strength thin film such as titanium nitride on the surface of metal material, ion nitriding or ion carburizing, etc. are performed. However, in the case of the thin film coating, the coating layer may be separated due to weak adhesion to base material, and in the case of the ion nitriding or ion carburizing, parts may be easily heat-distorted due to high process temperature.

And, ion implantation which accelerates ions with high energy and injects them on the surface of material is performed. The ion implantation is a technology for accelerating ions to several tens to hundreds of keV so as to be entered on the surface of material, and it may form a modified layer to several thousands of Å below the surface of material, and form a gradual composition change layer, and thus, coating layer separation due to difference in material is not basically generated. Other advantages of the ion implantation are that it is not thermodynamically limited because it is a high energy process, there is no size change of a sample due to temperature increase or deterioration by heat because it is a room temperature process, and surface roughness is not largely influenced. Furthermore, the kind, thickness, and modification degree of a modified layer may be easily controlled by controlling the kind, energy, and amount of implanted ions.

However, despite many advantages of the ion implantation technology, the use of the ion implantation is very limited in the fields of materials except semiconductor. The reason therefore is as follows: The existing ion implantation apparatus has been developed for the purpose of impurity doping on a planar semiconductor wafer sample, and it extracts ions from ion source and accelerates them so as to be entered in the sample in the form of ion beams, and ion beams should be rastered for uniform ion implantation. A method of implanting ions in the form of ion beams has technological disadvantage including a necessity of masking to prevent sputtering by inclinedly entering ions and three-directional rotation of a sample for ion implantation to a three-dimensional object such as a mold, a tool, a machine element part, etc. because of fundamental limitation of Line-of-sight implantation. The above disadvantages, together with very expensive equipment cost compared to the other surface modification equipments, make practical application of the ion implantation technique difficult.

To overcome the disadvantages of the ion implantation technology in the form of ion beam, plasma ion implantation technology using plasma and high voltage pulse has been suggested (U.S. Pat. No. 4,764,394, Korean Patent No. 137704, European Patent No. 480688, Canada Patent No. 2052080, U.S. Pat. No. 5,126,163), which is a technology capable of uniformly implanting ions on the surface of a three-dimensional sample with large area to achieve surface modification. Specifically, since it uses plasma and high voltage pulse, it is not limited by 'Child-Langmuir current limit' and thus speed of uniform ion implantation to a sample with large area is very rapid, and ion beam rastering equipment is not required. And, since it uses plasma, charging on the surface of a sample does not substantially exist, and since the equipment is simple, clustering with other thin film process equipment is excellent and the equipment cost may be lowered.

However, most plasma ion implantation technologies so far suggested and used are capable of ion implantation of only a gas state such as nitrogen, oxygen, argon, methane, etc., and it cannot implant plasma ions of an element existing in a solid state. Although some prior art U.S. Pat. No. 5,777,438, U.S. Pat. No. 5,126,163) discloses plasma ion implantation of a solid element using pulsed cathodic vacuum arc, in case pulsed cathodic arc plasma is used, macroparticles of large size (droplet) are generated due to the arc and deposited on the surface of an ion implantation sample, and to prevent this, a filter using a magnetic field should be used.

SUMMARY OF THE INVENTION

The present invention provides a method and an apparatus for plasma ion implantation of a solid element, which enables plasma ion implantation of non-gaseous elements at room temperature.

According to one aspect of the present invention, provided is a method and an apparatus for plasma ion implantation of a solid element, which enables plasma ion implantation of a solid element. According to the apparatus and method, a sample is placed on a sample stage in a vacuum chamber, and the inside of the vacuum chamber is maintained as a vacuum state. And, gas is supplied in the vacuum chamber, a first pulsed DC power is applied to a magnetron sputtering source so as to generate plasma ions of a solid element. The first power is a pulse DC power capable of applying a high pulsed DC power the moment a pulse is applied while maintaining low average power. And, simultaneously with the applying of the first pulse power, a second power may be supplied to the sample stage, which is a high negative voltage pulse accelerating plasma ions of a solid element to the sample and synchronized to the pulse DC power for magnetron sputtering source. And, inductively coupled plasma may be generated in the vacuum chamber via RF antenna so as to increase ionization rate of a solid element and to enable lower pressure operation of magnetron sputtering source.

The present invention may effectively implant ions of an element existing as a solid at room temperature on the surface of a sample, and it may be widely applied for high-functionalizing surface characteristics through ion implantation of various elements.

Figure 1:
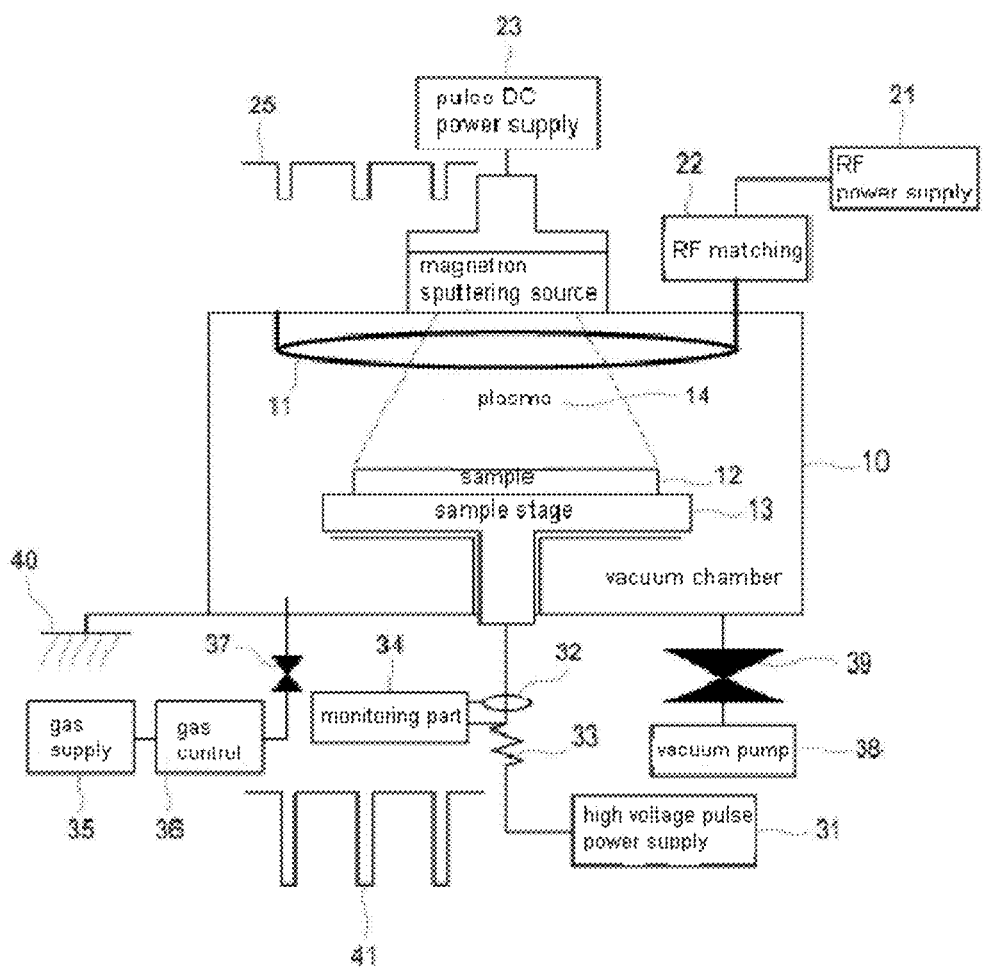
FIG. 1 shows the schematic diagram of an apparatus for plasma ion implantation of a solid element according to exemplary embodiment of the present invention.

| * Explanations of reference numerals of drawings | |
|---|---|
| 10: vacuum chamber | 11: RF antenna |
| 12: sample | 13: sample stage |
| 14: plasma | 21: RF power supply |
| 22: RF matching | 23: pulse DC power supply |
| 24: sputtering source (magnetron sputtering source) | |
| 25: pulse DC | 31: high voltage pulse power supply |
| 32: pulse current measuring | 33: pulse voltage measuring |
| 34: monitoring part | 35: gas supply |
| 36: gas control | 37: gas valve |
| 38: vacuum pump | 39: vacuum valve |
| 40: vacuum chamber ground | 41: high voltage pulse |

DETAILED DESCRIPTION OF THE EMBODIMENTS

The embodiment of the present invention will be explained in detail referring to drawings. However, in case there is a concern that the subject of the present invention may be obscured, detailed explanations of widely known functions or compositions are omitted.

FIG. 1 shows a schematic diagram of the apparatus for plasma ion implantation of a solid element according to embodiment of the present invention.

The apparatus for plasma ion implantation of a solid element according to the present invention comprises a vacuum chamber (10) maintaining a vacuum state inside, a magnetron sputtering source (24), a sample stage (13) installed opposite to the sputtering source in the vacuum chamber, on which a sample (12) is mounted, and a first pulsed DC power supply for applying a pulsed DC power to the magnetron sputtering source (24). According to one embodiment, the first power is a pulse DC power (25) capable of applying a high pulsed power the moment a pulse is applied, and the first power supply means is a pulse DC power supply (23). According to one embodiment, the pulse DC power (25) has a power density of 10 W/cm$^2$~10 kw/cm$^2$, frequency of 1 Hz to 10 kHz, and a pulse width of 10 μsec to 1 msec.

And, the apparatus for plasma ion implantation of a solid element according to the present invention further comprises a second power supply means for supplying a second power to the sample stage (13). According to one embodiment, the second power is a high negative voltage pulse (41) that accelerates the plasma ions of a solid element to the sample (12) and is synchronized to the pulse DC power for the magnetron sputtering source (24), and the second power supply means is a high negative voltage pulse power supply (31). According to one embodiment, the high voltage pulse (41) that is synchronized to the pulse DC power applied to the magnetron sputtering source (24) has a frequency of 1 Hz~10 kHz, which is exactly the same as the frequency of the pulse DC power the magnetron sputtering source (24), a pulse width of 1 usec~200 usec, and a negative pulse high voltage of −1 kv~−100 kV.

The vacuum chamber preferably has an internal gas pressure of 0.5 mTorr to 5 mTorr. For this, the apparatus for plasma ion implantation of a solid element according to the present invention further comprise a gas supply (35) for supplying gas to the vacuum chamber, and a gas control part (37) for controlling the pressure (or flow rate) of the gas supplied by the gas supply (35).

According to one embodiment, the sample (12) is a silicon wafer sample, and the sample stage (13), on which the sample (12) is mounted, is electrically insulated from the vacuum chamber (10).

And, the apparatus for plasma ion implantation of a solid element according to the present invention further comprise an inductively coupled plasma source in the vacuum chamber (10) so that the ionization rate of solid elements may be increased and the operation pressure of the magnetron sputtering source (24) may be lowered than a common magnetron sputtering source. According to one embodiment, the inductively coupled plasma source comprises an RF antenna (11) mounted inside the vacuum chamber (10) and RF generator so as to generate the inductively coupled plasma, an RF power supply (21) for applying RF power to the RF antenna, and an RF matching part (22) for RF impedance matching of the RF power supply (21) for the RF antenna (11).

And, the apparatus for plasma ion implantation of a solid element according to the present invention further comprise a means for measuring and monitoring ion implantation voltage and current when ions are implanted. The means comprises a pulse current measuring part (32) for measuring current and voltage when plasma ions of a solid element are implanted, a pulse current voltage measuring part (33), and a monitoring part (34) for monitoring the measured current and voltage.

The principles of the apparatus for plasma ion implantation of a solid element according to the present invention are as follow.

The vacuum chamber (10) maintains a predetermined base vacuum degree by a vacuum pump (38) and a vacuum valve (39), and is grounded through a ground part (40).

First, a sample (12) is mounted on a sample stage (13) positioned in the vacuum chamber (10), and then, the vacuum chamber (10) is exhausted to a high vacuum degree using the vacuum pump (38). And then, gas is introduced through a gas control part (36) so as to control the internal gas pressure of the vacuum chamber (10). At this time, the amount of gas supplied from the gas supply (35) is controlled by the gas control part (36), and the gas filled in the vacuum chamber (10) is supplied through the gas valve (37). According to one embodiment, as the gas for generating plasma, argon, nitrogen, oxygen, methane, carbon monoxide, carbon dioxide, ammonia, acetylene, benzene gas, and a mixed gas thereof, etc. may be used. According to one embodiment, the internal gas pressure of the vacuum chamber (10) is controlled to 0.5 mTorr~5 mTorr. If the internal gas pressure of the vacuum chamber (10) is 0.5 m Torr or less, plasma generation may be difficult, and if the pressure is high as 5 mTorr or more, energy loss of accelerated ions (solid ions) may be very serious due to frequent collision of the accelerated ions with surrounding gas particles.

If the pressure in the vacuum chamber (10) is stabilized after inlet of gas for use, RF power is applied to the RF antenna (11) installed in the vacuum chamber (1) through the RF power supply (21) and the RF matching part (22) so as to generate inductively coupled plasma (14) of the gas for use. However, in addition to the above method, plasma may be generated using filament discharge or microwave. According to one embodiment, the RF antenna (11) is installed inside of the vacuum chamber (1), and in some cases, it may be installed outside of the vacuum chamber (10) with a dielectric such as quartz or alumina, etc. as a boundary. The RF power supply (21) supplies RF power to the RF antenna (11) so as to generate plasma. And, to prevent power loss between the RF power supply (21) and the RF antenna (11), an RF matching part (22) for electrically matching them is connected therebetween.

After generating plasma (14), a pulse DC power (25) is applied from the pulse DC power supply (23) to the magnetron sputtering source (24) installed in the vacuum chamber

(10) so as to operate the magnetron sputtering source (24), and simultaneously a high negative voltage pulse (41) is applied from the high negative voltage pulse power supply (31) to the sample stage (13) so as to perform plasma ion implantation process. The high voltage pulse (41) supplied by the high voltage pulse power supply (31) is applied to the sample stage (13) on which the sample (12) is mounted, and thus, applied to the sample (12). And, the sample stage (13) installed in the vacuum chamber (10) is electrically insulated to the vacuum chamber (10). The sample stage (13) is preferably a plate-shaped so that solid ions may be uniformly injected only on the upper surface of the sample (12) with large area. The sample stage (13) may be formed of any conductive material as long as it may apply a high voltage pulse (41). For example, it may be formed of copper or stainless steel, but is not limited thereto. According to one embodiment, the high negative voltage pulse (41) supplied by the high voltage pulse power supply (31) applied a voltage of −1 kV~−100 kV.

Figure 2:
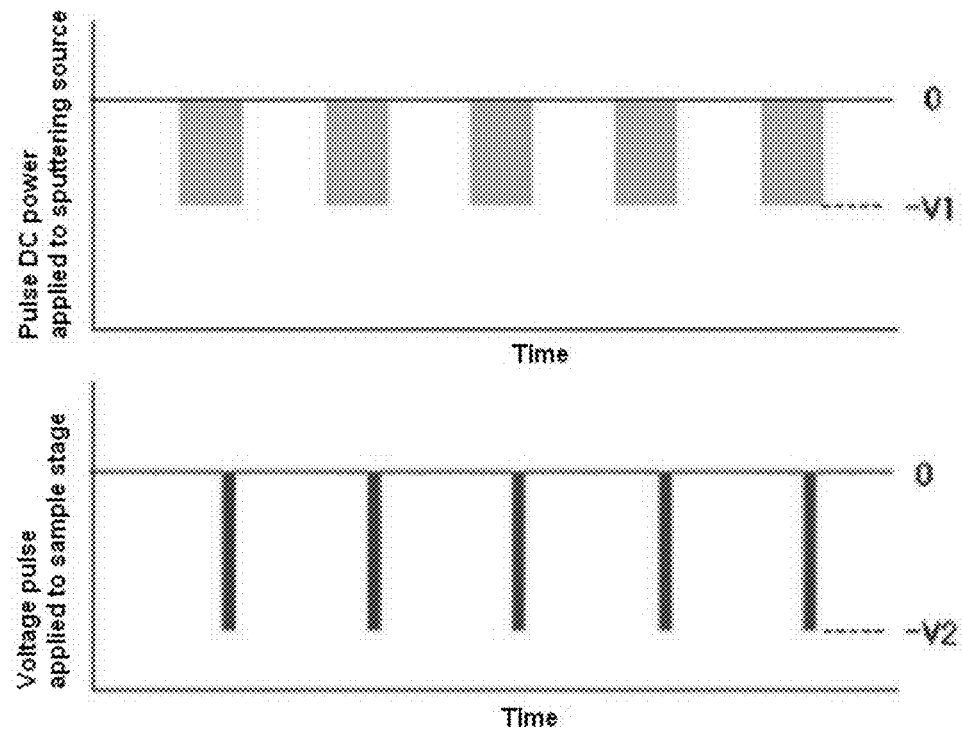
FIG. 2 shows the concept of timing synchronization of pulse DC power applied to magnetron sputtering source of an apparatus for plasma ion implantation of a solid element of the present invention with a high negative voltage pulse applied to a sample stage.

If a negative (−) DC high voltage is applied, ions are extracted from the solid element plasma generated from the magnetron sputtering source and accelerated to the sample thus achieving ion implantation. Particularly, the high voltage pulse (41) applied to the sample stage (13) is synchronized to the pulse DC power (25) applied to the magnetron sputtering source (24) so as to be operated with the same frequency, as shown in FIG. 2. The reason therefore is as follows.

The moment the magnetron sputtering source (24) is pulsed-on by the pulse DC power (25), a solid element sputtered from the magnetron sputtering source (24) is ionized by high density plasma, and the generated ions of a solid element are accelerated to the sample (12) by high negative voltage pulse (41) applied to the sample stage (13) and implanted on the surface of the sample (12). Thus, the high voltage pulse (41) should be synchronized to the pulse DC power (25) for the magnetron sputtering source (24). Meanwhile, ion implantation voltage and current at ion implantation are measured by the monitoring part (34) of a plasma ion implantation process using the pulse voltage measuring part (33) and the pulse current measuring part (32).

The pulse DC power (25) applied to the magnetron sputtering source (24) may have a power density of 10 W/cm²~10 kw/cm², but not limited thereto. If the density of the pulse DC power is 10 W/cm² or less, generation of high density plasma with high ionization rate from the magnetron sputtering source (24) may be difficult, and it if is 10 kw/cm² or more, it may be practically difficult to manufacture a pulse DC power supply (23). According to one embodiment, the pulse DC power (25) has an operation frequency of 1 Hz 10 kHz and pulse width of 10 usec~1 msec. If the frequency is 1 Hz or less, lots of times may be consumed for plasma ion implantation process thus decreasing economical value, and there may be a lot of difficulties in manufacture of the pulse DC power supply (23) operating at high frequency of 10 kHz or more. And, if a short pulse width of 10 usec or less is used, generation of high density plasma may be insufficient and thus ionization rate of the generated solid element may be low, and if a long pulse width of 1 msec or more is used, a probability of arcing will be increased in the magnetron sputtering source (24) is high due to high pulse power, thus rendering the process unstable.

And, for the operation frequency, pulse width and negative (−) pulse high voltage of the high voltage pulse (41) applied to the sample stage (13), although not limited thereto, a frequency of 1 Hz~10 kHz which is the same as the pulse DC power (25) applied to the magnetron sputtering source (24) may be synchronized and used, and, a pulse width of 1 usec~200 usec, and a negative (−) pulse high voltage of −1 kv~−100 kV may be used. With a short pulse width of 1 usec or less, plasma ion implantation may not be effectively performed, and with a long pulse of 200 usec or more, plasma sheath due to the negative (−) high voltage applied to the sample stage (13) may be too expanded and touch the wall of the vacuum chamber (10) thus causing a concern that plasma may be extinguished, and a probability of arcing is high due to the lengthened applying time of high voltage to the sample stage (13). And, with a low voltage of −1 kV or less, a depth of ion implantation to the surface of the sample (12) may be too low, and manufacture of a high pulse power supply (31) of −100 kV or more is practically difficult.

The apparatus for plasma ion implantation of a solid element according to the present invention has the following characteristics.

The magnetron sputtering source (24), which is commonly used as a deposition source for thin film deposition, is operated with a pulse mode using a pulse DC power (25), and a high negative voltage pulse (41) synchronized thereto is applied to the sample (12) so as to effectively accelerate solid ions generated from the magnetron sputtering source (24) thus achieving ion implantation on the surface of the sample (12). In case the magnetron sputtering source (24) is operated with a pulse mode instead of continuous operation, very high power may be applied the moment a pulse is applied while maintaining low average power so as not to cause any problem in cooling of a magnetron target and thus, high density plasma may be generated on the surface of the magnetron sputtering source (24), which increases ionization rate of the elements emitted from the surface of the magnetron. The generated ions of the magnetron target element are accelerated to the sample (12) by the synchronized high negative voltage pulse (41) applied to the sample (12), and implanted on the surface of the sample (12). And, by generating inductively coupled plasma (14) using an RF antenna (11) positioned between the magnetron sputtering source (24) and the sample (12), ionization rate of the emitted solid element may be further increased, and operation at a lower pressure than a common operation pressure of magnetron sputtering source is enabled, thereby minimizing collision with gas particles during ion implantation to effectively perform plasma ion implantation of a solid element.

A plasma ion implantation experiment of a solid element with the apparatus according to the present invention is performed as follows.

As the magnetron sputtering source (24), a titanium target with a diameter of 75 mm and a thickness of 6 mm is used, and as the ion implantation sample (12), a silicon wafer is used. The silicon wafer sample (12) is mounted on the sample stage (13), and then, the vacuum chamber (10) is exhausted to a vacuum degree of $3 \times 10^{-6}$ Torr, and argon gas is introduced to maintain the argon pressure in the vacuum chamber (10) to 1.5 mTorr. And, RF power of 13.56 MHz, 200 Watt is applied to the RF antenna (11) for generating inductively coupled plasma so as to generate argon plasma, and then, a pulse DC power (25) is applied to the magnetron sputtering source (24) so as to pulse-on the magnetron sputtering source (24). For the pulse DC power (25) applied to the magnetron sputtering source (24), a pulse DC power of about 350 W/cm² with a voltage of −1.3 kV and a current of 12 A is used. And, the frequency of the pulse DC power (25) is 100 Hz, and the pulse width is 200 usec. Thus, the average pulse DC power (25) is 315 W, so that there will be no problem in cooling of the magnetron sputtering source (24).

In a first experiment, the magnetron sputtering source (24) is pulsed on by the above method, and then, simply deposited on the silicon wafer sample (12) without applying a high negative voltage pulse (41) to the sample stage. And, in a second experiment, ion implantation process is performed for 30 minutes by pulsing-on the magnetron sputtering source (24) and simultaneously applying a high negative voltage pulse (41) to the silicon wafer sample (12). The high voltage pulse (41) used in the second experiment has a voltage of −60 kV and a pulse width of 40 usec, and the frequency is 100 Hz which is the same as the magnetron sputtering source (24) so as to be synchronized. And, by applying a high voltage pulse (41) of 40 usec to the silicon wafer sample (12) about 150 usec after the pulse DC power (25) of 200 usec for magnetron sputtering source is applied, plasma ion implantation is allowed to be performed at a sufficiently high plasma ion density of a solid element. After the ion implantation process, to prevent oxidation of the surface of the sample (12), titanium is simply deposited for 10 minutes without applying a negative (−) high voltage as the first experiment.

Figure 3A:
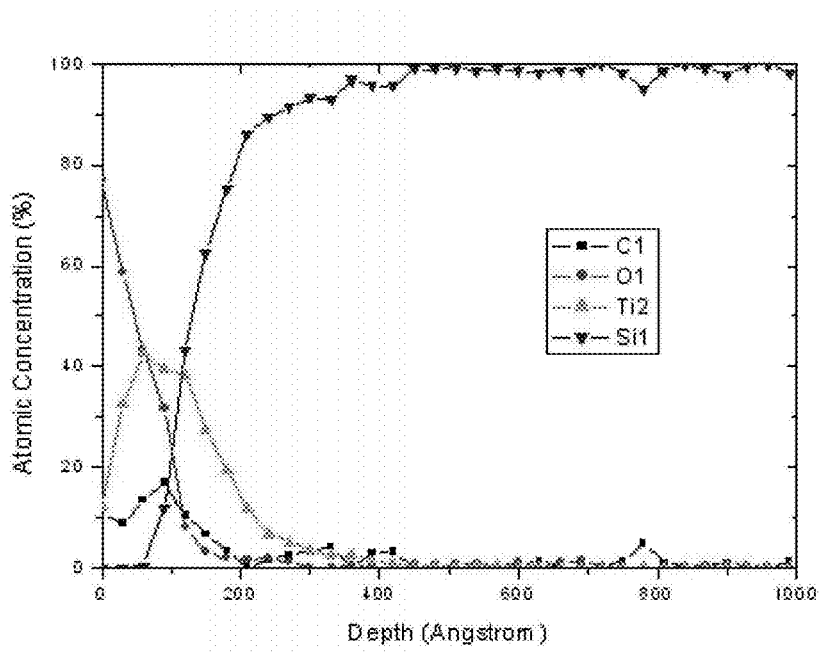
FIG. 3a shows the measurement result of elemental distribution of a titanium-deposited silicon sample in a depth direction.
Figure 3B:
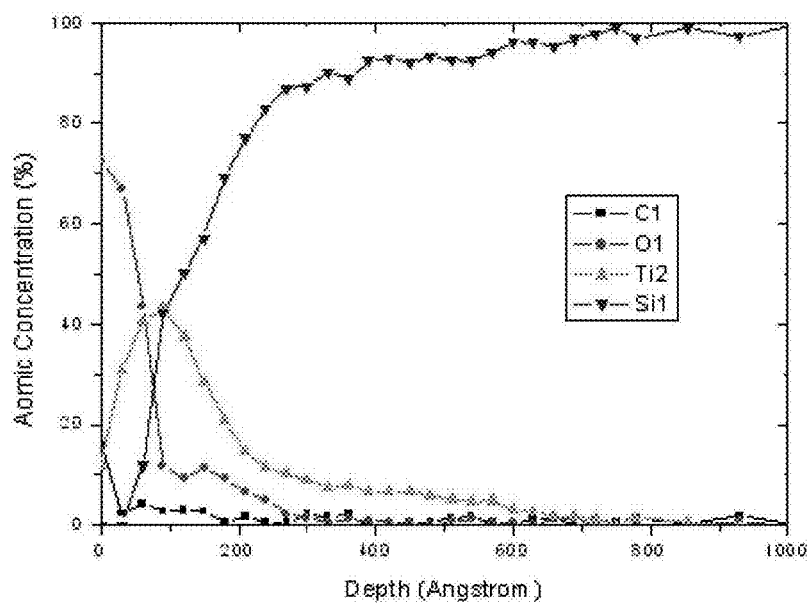
FIG. 3b shows the measurement result of elemental distribution of a titanium ion-implanted silicon sample in a depth direction according to the embodiment of the present invention.

FIG. 3a shows the result of the first experiment, which is Auger analysis result for measuring the elemental distribution in a depth direction of the silicon wafer sample (12) wherein a titanium thin film is simply deposited on the silicon wafer sample (12) without applying high voltage pulse (41). FIG. 3b shows the result of the second experiment, which is Auger analysis result of elemental distribution in a depth direction of the silicon wafer sample (12) wherein titanium ions are implanted to the silicon wafer sample (12) with applying a high negative voltage pulse (41) to the silicon wafer sample (12), and a titanium thin film is deposited thereon.

Comparing the titanium distribution of the two samples (FIG. 3a, FIG. 3b), the difference can be definitely seen. Specifically, in the case of simple deposition without titanium ion implantation (FIG. 3a), titanium distribution ends at about 400 Å below the surface, while in the case of titanium ion implantation (FIG. 3b), ions are implanted to about 900 Å below the surface. Therefore, it can be seen that plasma ion implantation of a titanium element is effectively achieved according to the present invention.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An apparatus for plasma ion implantation of a solid element comprising
    a vacuum chamber maintaining a vacuum state inside;
    a magnetron sputtering source installed inside the vacuum chamber;
    a sample stage installed opposite to the magnetron sputtering source in the vacuum chamber to mount a sample;
    a first power supply generating a pulse DC power and applying the pulse DC power to the magnetron sputtering source so as to generate pulsed plasma ions of a solid element sputtered from the magnetron sputtering source; and
    a second power supply generating a negative voltage pulse and supplying the negative voltage pulse to the sample stage to accelerate the pulsed plasma ions of a solid element from the magnetron sputtering source to the sample,
    wherein the negative voltage pulse has a same frequency as the pulse DC power and is synchronized to the pulse DC power,
    wherein both the negative voltage pulse and the pulse DC power have on time periods and off time periods and the on time periods of the negative voltage pulse are within the on time periods of the pulse DC power,
    wherein the negative voltage pulse to the sample stage has a same frequency of 1 Hz to 10 kHz as that of the pulse DC power, and
    wherein the negative voltage pulse has a pulse width of 1 μsec to 200 μsec and a pulse high voltage of −1 kV to −100 kV.

2. The apparatus of claim 1, further comprising
    a gas supply for supplying gas to be made into plasma to the vacuum chamber;
    a gas control part for controlling a flow rate of the gas supplied by the gas supply; and
    an inductively coupled plasma source for changing the gas into a plasma state.

3. The apparatus of claim 1, wherein the pulse DC power has a pulse DC power density of 10 W/cm$^2$ to 10 kw/cm$^2$.

4. The apparatus of claim 2, wherein the inductively coupled plasma source comprises
    an RF antenna mounted in the vacuum chamber so as to generate the inductively coupled plasma;
    an RF power supply for applying RF power to the RF antenna; and
    an RF matching part for RF impedance matching of the RF power supply with the RF antenna.

5. A method for plasma ion implantation of a solid element comprising
    placing a sample on a sample stage in a vacuum chamber of an apparatus for plasma ion implantation of a solid element;
    maintaining the inside of the vacuum chamber a vacuum state;
    supplying a gas to be made into plasma in the vacuum chamber;
    applying a pulse DC power to a magnetron sputtering source installed opposite to the sample stage in the vacuum chamber of the apparatus for plasma ion implantation of a solid element so as to generate pulsed plasma ions of a solid element; and
    accelerating the pulsed plasma ions of a solid element to the sample by supplying a negative voltage pulse to the sample stage,
    wherein the negative voltage pulse is synchronized to the pulse DC power,
    wherein both the negative voltage pulse and the pulse DC power have on time periods and off time periods and the on time periods of the negative voltage pulse are within the on time periods of the pulse DC power,
    wherein the negative voltage pulse to the sample stage has a same frequency of 1 Hz to 10 kHz as that of the pulse DC power, and
    wherein the negative voltage pulse has a pulse width of 1 μsec to 200 μsec and a pulse high voltage of −1 kV to −100 kV.

6. The method of claim 5, further comprising generation of inductively coupled plasma, after supplying the gas and before generating plasma ions of a solid element.

7. The method of claim 5, wherein the pulse DC power has a pulse DC power density of 10 W/cm$^2$ to 10 kw/cm$^2$.

8. The method of claim 5, wherein the vacuum chamber has an operation gas pressure of 0.5 mTorr to 5 mTorr.

9. The method of claim 6, wherein the inductively coupled plasma is generated by an inductively coupled plasma source comprising an RF antenna mounted inside or outside the vacuum chamber so as to generate the inductively coupled plasma;
an RF power supply for applying RF power to the RF antenna; and
an RF matching part for RF impedance matching of the RF power supply with the RF antenna.

\* \* \* \* \*